(12) United States Patent
Tuller et al.

(10) Patent No.: US 6,627,965 B1
(45) Date of Patent: Sep. 30, 2003

(54) MICROMECHANICAL DEVICE WITH AN EPITAXIAL LAYER

(75) Inventors: Harry L. Tuller, Wellesley, MA (US); Richard Mlcak, Cambridge, MA (US); Dharanipal Doppalapudi, Somerville, MA (US)

(73) Assignee: Boston MicroSystems, Inc., Woburn, MA (US)

( * ) Notice: Subject to any disclaimer, the term of this patent is extended or adjusted under 35 U.S.C. 154(b) by 0 days.

(21) Appl. No.: 09/500,407

(22) Filed: Feb. 8, 2000

(51) Int. Cl.[7] .............................................. H01L 29/82
(52) U.S. Cl. ................... 257/415; 73/514.34; 73/514.33
(58) Field of Search ................................ 257/415–419, 257/619; 438/50, 52, 53; 73/35.11, 35.13, 778, 514.33, 514.34, DIG. 4

(56) References Cited

U.S. PATENT DOCUMENTS

| | | | |
|---|---|---|---|
| 4,511,816 A | 4/1985 | Mikoshiba et al. | 310/313 A |
| 4,744,863 A | 5/1988 | Guckel et al. | 156/653 |
| 4,783,237 A * | 11/1988 | Aine et al. | 438/52 |
| 4,839,708 A | 6/1989 | Kano et al. | 357/26 |
| 4,849,071 A | 7/1989 | Evans et al. | 156/644 |
| 4,993,143 A | 2/1991 | Sidner et al. | 29/621.1 |
| 5,165,283 A | 11/1992 | Kurtz et al. | 73/727 |
| 5,237,182 A | 8/1993 | Kitagawa et al. | 257/15 |
| 5,303,594 A | 4/1994 | Kurtz et al. | 73/727 |
| 5,338,416 A | 8/1994 | Mlcak et al. | 204/129.3 |
| 5,446,330 A | 8/1995 | Eda et al. | 310/313 R |
| 5,464,509 A | 11/1995 | Mlcak et al. | 204/129.3 |
| 5,470,797 A | 11/1995 | Mastrangelo | 437/225 |
| 5,520,785 A | 5/1996 | Evans et al. | 204/192.27 |
| 5,549,006 A | 8/1996 | Kurtz | 73/708 |
| 5,587,014 A | 12/1996 | Iyechika et al. | 117/90 |
| 5,604,144 A | 2/1997 | Kurtz | 437/51 |
| 5,631,198 A | 5/1997 | Hartauer | 438/53 |
| 5,633,616 A | 5/1997 | Goto | 333/193 |
| 5,759,870 A | 6/1998 | Yun et al. | 437/228 |
| 5,847,397 A | 12/1998 | Moustakas | 250/370.06 |
| 5,903,017 A | 5/1999 | Itaya et al. | 257/190 |
| 5,966,053 A * | 10/1999 | Durig et al. | 331/116 M |
| 6,069,021 A | 5/2000 | Terashima et al. | 438/46 |
| 6,087,701 A * | 7/2000 | Bergstrom et al. | 257/414 |
| 6,110,278 A | 8/2000 | Saxena | 117/95 |
| 6,147,364 A | 11/2000 | Itaya et al. | 257/76 |
| 6,150,674 A | 11/2000 | Yuri et al. | 257/103 |
| 6,177,292 B1 | 1/2001 | Hong et al. | 438/46 |
| 6,194,744 B1 | 2/2001 | Udagawa et al. | 257/94 |
| 6,232,139 B1 | 5/2001 | Casalnuovo et al. | 438/48 |
| 6,268,629 B1 * | 7/2001 | Noguchi | 257/345 |
| 6,290,774 B1 | 9/2001 | Solomon et al. | 117/89 |

OTHER PUBLICATIONS

Tuller, H.L. and Mlcak, R., "Photo–assisted Silicon Micromachining: Opportunities for Chemical Sensing," *Sensors and Actuators*, pp. 255–261 (1996).

Foresi, J.S. and Moustakas, T.D., "Piezoresistance and Quantum Confinement in Microcrystalline Silicon," *Mat. Res. Soc. Symp. Proc.* vol. 256, 77–82 (1992).

Lei T., et al., "Epitaxial Growth and Characterization of Zinc–blende Gallium Nitride on (001) Silicon," *J. Appl. Phys.*, 71(10):4933–4943 (1992).

Stevens, K.S., et al., "Microstructure of AlN on Si (111) Grown by Plasma–assisted Molecular Beam Epitaxy," *Appl. Phys. Lett.*, 65(3):321–323 (1994).

(List continued on next page.)

*Primary Examiner*—Nathan J. Flynn
*Assistant Examiner*—Leonardo Andujar
(74) *Attorney, Agent, or Firm*—Hamilton, Brook, Smith & Reynolds, PC

(57) ABSTRACT

A micromechanical device includes a single crystal micromechanical structure where at least a portion of the micromechanical structure is capable of performing a mechanical motion. An epitaxial layer covers at least a portion of the micromechanical structure. In one embodiment, the micromechanical structure and the epitaxial layer are formed of different materials.

24 Claims, 5 Drawing Sheets

OTHER PUBLICATIONS

Basu, S.N., et al., "Microstructures of GaN Films Deposited on (001) and (111) Si Substrates Using Electron Cyclotron Resonance Assisted–molecular Beam Epitaxy," *J. Mater. Res.,* 9(9):2370–2378 (1994).

Marchand, H., et al., "Structural and Optical Properties of GaN Laterally Overgrown an Si(111) by Metalorganic Chemical Vapor Deposition Using on AlN Buffer Layer," *MRS Internet Journal Nitride Semiconductor Research,* 4(2): 1–10 (1999).

Hellman, E.S., et al., "Nucleation of AlN on the (7 x7) Reconstructed Silicon (1 1 1) Surface," *MRS Internet Journal Nitride Semiconductor Research,* 3(43): 1–5 (1998).

Ziermann, R., et al., "A High Temperature Pressure Sensor With β–SiC Piezoresistors On SOI Substrates," International Conference on Solid–State Sensors and Actuators, Chicago, IL, Jun. 16–19, 1997.

Okojie, R.S., et al., "Operation of α (6H)–SiC Pressure Sensor at 500° C.," *Sensors and Actuators,* A 66:200–204 (1998).

von Berg, J., et al., "High Temperature Piezoresistive β–SiC–on–SOI Pressure Sensor for Combustion Engines," *Materials Science Forum,* 264–268:1101–1104 (1998).

Okojie, R.S., et al., "α(6H)–SiC Pressure Sensors for High Temperature Applications," *IEEE the Ninth Annual International Workshop on Micro Electro Mechanical Systems,* pp. 146–149 (1996).

Eickhoff, M., et al., "Accelerated Aging of Micromachined Silicon/Siliconcarbide Diaphragms by the Application of Pressure and Temperature," contribution to Micro Materials 1997 Conference, Berlin, Germany (Apr. 1997).

Bartek, M., et al., Vacuum Sealing of Microcavities Using Metal Evaporation, *Sensors and Actuators,* A 61:364–368 (1997).

Shor, J.S. and Davidson, J.L., "SiC Microsensor with Piezoresistive Diamond Sensing Elements," (Report No. ARO 30676.1–EL–SBI). U.S. Army Research Office, Research Triangle Park, NC (1992).

U.S. Ser. No. 09/500,408 filed Feb. 8, 2000, entitled "Semiconductor Piezoresistor" (copy not included).

Perkins, N.R., et al., "Halide Vapor Phase Epitaxy of Gallium Nitride Films on a Sapphire and Silicon Substrates," *Mat. Res. Soc. Symp. Proc. 395:243–249* (1996).

U.S. patent application Publication No. US 2001/0008656 A1, Tischler et al., Jul. 19, 2001.

* cited by examiner

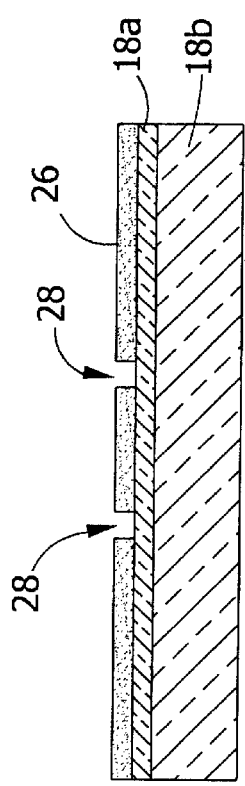
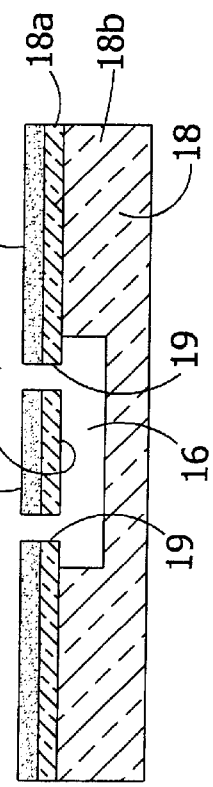
FIG. 3D
FIG. 3E
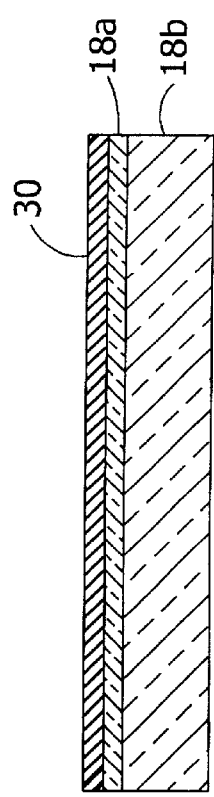
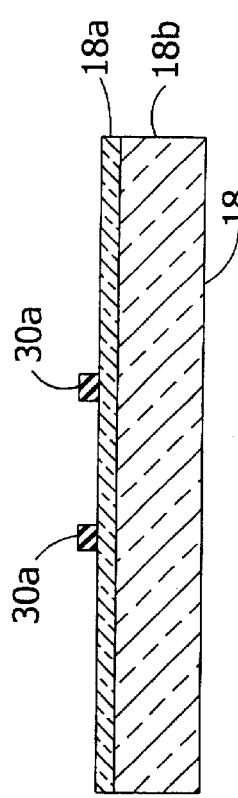
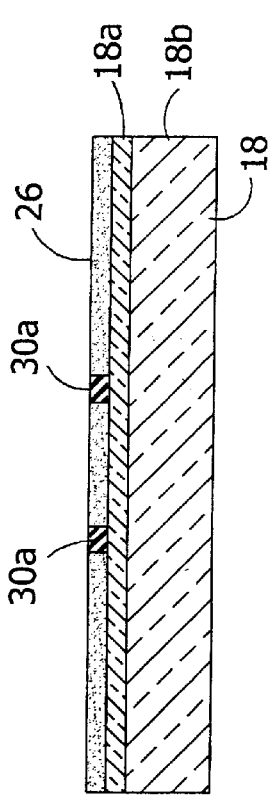
FIG. 3A
FIG. 3B
FIG. 3C

MICROMECHANICAL DEVICE WITH AN EPITAXIAL LAYER

BACKGROUND OF THE INVENTION

Miniaturized devices, such as actuators, micro-optics, micro-fluidics, tunable electronics (filters), scanning probe microscope tips, micropower generators, and sensors (for example, temperature, pressure, acceleration, flow, radiation, chemical species etc.) sometimes include micromechanical structures formed from semiconductor materials. The micromechanical structures can be, for example, a membrane, cantilever beam, or tethered proof mass, etc., which is designed to be perturbed by external stimuli when used as a sensor, or to produce a motion when used as an actuator. Typically, the micromechanical structures are micromachined by an etching process. In some instances, a film of polycrystalline material is deposited over the micromechanical structure to provide the micromechanical structure with additional properties. For example, the film may have piezoresistive, piezoelectric, etc., properties. A drawback of polycrystalline films is that it is difficult to produce polycrystalline films that have constistent or uniform properties. In addition, some desirable functional properties are not provided by polycrystalline films. Furthermore, polycrystalline films are usually less stable at high temperatures and corrosive environments which restricts operation of devices including these films to lower temperatures and less corrosive environments.

SUMMARY OF THE INVENTION

The present invention provides a micromechanical device with highly reproducible properties and improved functionality that is capable of operating at higher temperatures and in more corrosive environments than previous devices. The micromechanical device includes a single crystal micromachined micromechanical structure. At least a portion of the micromechanical structure is capable of performing a mechanical motion. An epitaxial layer covers at least a portion of the micromechanical structure. The micromechanical structure and the epitaxial layer are formed of different materials.

In preferred embodiments, the micromechanical structure and epitaxial layer are each preferably formed from a material selected from the group consisting of group IV, III–V, II–VI and IV–VI semiconductors. In particular, the micromechanical structure is preferably formed from a material selected from the group of solids consisting of Si, Ge, SiC, GaAs, InAs, InP GaP, GaSb, InSb, GaN, ZnO, CdTe and ZnTe. The epitaxial layer is preferably formed from a material selected from the group of solid solutions consisting of SiGeC, AlGaInPAsSb, AlGaInN and ZnCdHgOSSeTe. In one embodiment, the epitaxial layer is formed before the micromechanical structure is micromachined. In another embodiment, the epitaxial layer is formed on the micromechanical structure after the micromechanical structure is micromachined. The function of the epitaxial layer is dependent upon the material selected. In one embodiment, the epitaxial layer is formed of a material that provides a protective layer for the micromechanical structure. In another embodiment, the epitaxial layer is formed of a material that provides a measurable response to external stimulation of the micromechanical device. A secondary layer or layers of material may be formed on the epitaxial layer such that the epitaxial layer acts as an intermediate layer. Depending upon the application and the materials chosen, the micromechanical device may be a sensor, an actuator, an electronic device or an optoelectronic device.

The present invention also provides a micromechanical device including a single crystal micromachined micromechanical structure. At least a portion of the micromechanical structure is capable of performing a mechanical motion. An epitaxial layer is formed on at least a portion of the micromechanical structure after the micromechanical structure is micromachined.

In the present invention, since the micromechanical structure and the epitaxial layer are each preferably formed from a single crystal material, the resulting properties (mechanical, electronic, optical, etc.) of the micromechanical device are more readily reproduced employing known micromachining and thin film deposition techniques. In addition, single crystal materials which are stable at high temperatures and in harsh environments can be used. This allows the present invention micromechanical device to be used in a wider range of applications than is possible with devices having polycrystalline films which are susceptible to microstructure changes and preferential attack at grain boundaries. For example, with the appropriate selection of materials, devices of the present invention can operate with greater functionality at temperatures exceeding 1000° C. as well as in environments found in gas turbines, internal combustion engines and munitions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 3A–3E are side sectional views depicting the formation of a micromechanical device according to another method.

DETAILED DESCRIPTION OF THE INVENTION

Figure 1A:
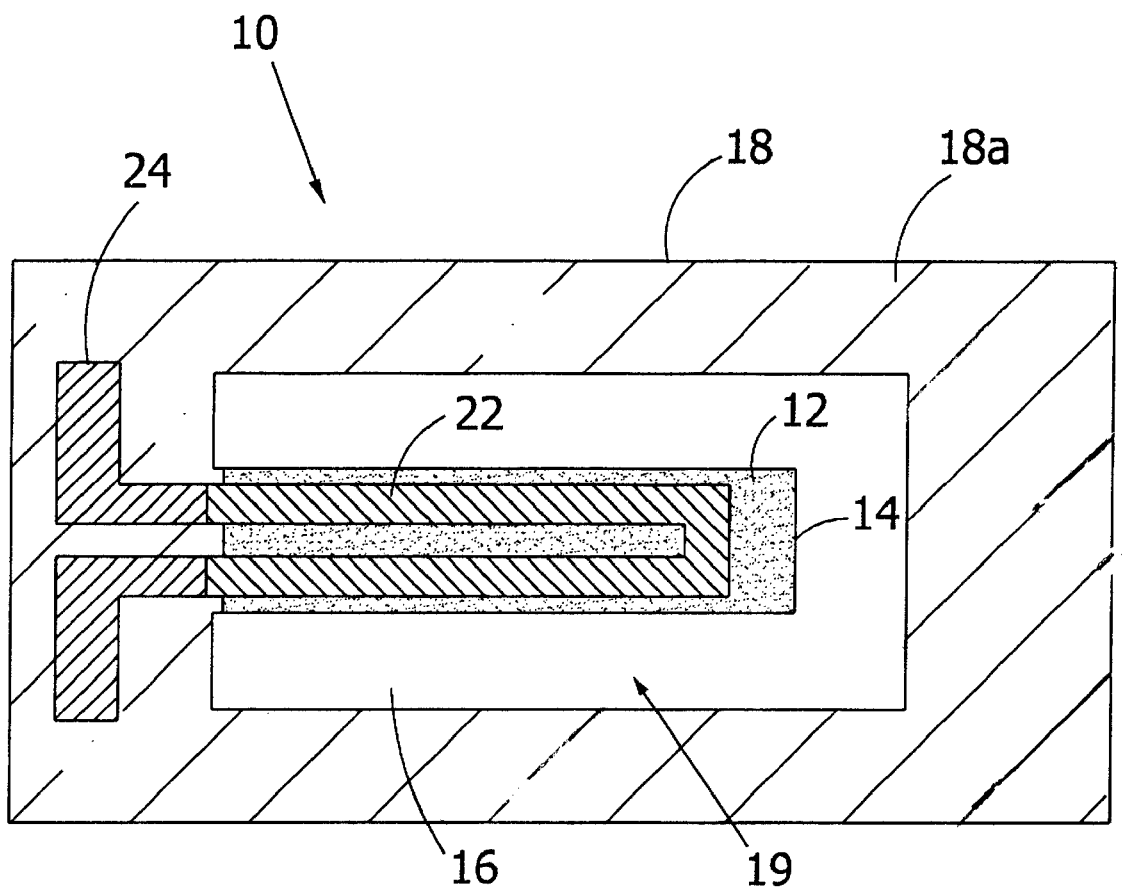
FIG. 1A is a plan view of an embodiment of a micromechanical device of the present invention.
Figure 1B:
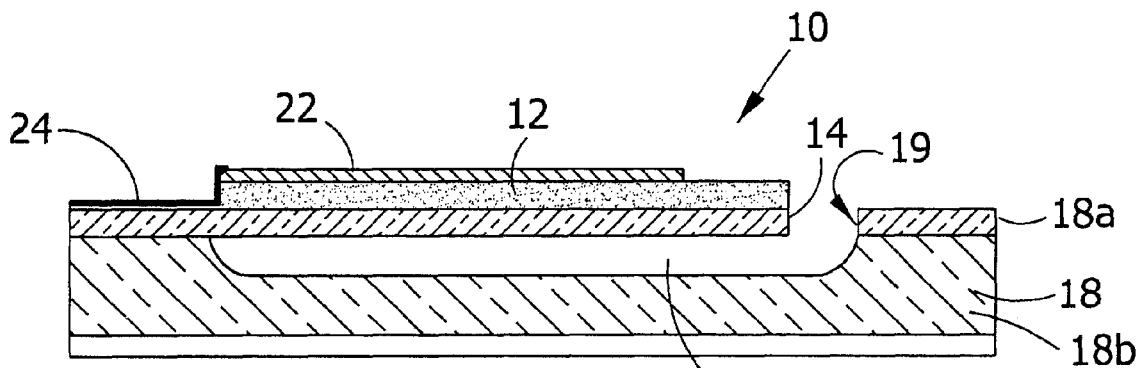
FIG. 1B is a side sectional view of the micromechanical device of FIG. 1A.

Referring to FIGS. 1A, and 1B, micromechanical device 10 is an embodiment of a temperature sensor which is one example of a micromechanical device of the present invention. Micromechanical device 10 includes a single crystal semiconductor base substrate 18 having an upper region 18a and a lower region 18b where one region is n-type and the other region is p-type. A pattern 19 is etched through the upper region 18a of base substrate 18. A cavity 16 extending from pattern 19 is etched within the lower region 18b and under the upper region 18a, thereby forming a cantilevered beam 14. An epitaxial layer or film 12 of single crystal material is formed over the cantilevered beam 14. The epitaxial layer 12 closely registers with the crystalline structure of base substrate 18 and for all practical purposes is considered a single crystalline film. However, it is understood that minor defects may exist in epitaxial layer 12 such as inclusions or low angle grain boundaries. In addition, epitaxial layer 12 may have a highly oriented columnar structure with some lattice mosaic in the film. The epitaxial layer 12 is formed of a material that has a different thermal expansion coefficient than the base substrate 18. A piezoresistive element 22 is formed over the epitaxial layer 12. Electrical contacts 24 are electrically connected to the opposite ends of piezoresistive element 22 allowing the measure of its change in resistance.

The difference in thermal expansion coefficient between the epitaxial layer 12 and the cantilevered beam 14 induces varying degrees of deflection of the cantilevered beam 14 in response to varying temperatures. In other words, for a particular temperature, the cantilevered beam 14 has a particular deflection. Changes in deflection of the cantilevered beam 14 causes changes in the resistance of the piezoresistive element 22 so that piezorestive element 22 has a particular resistance for a particular deflection of cantilevered beam 14. As a result, the resistance of the piezoresistive element 22 for a particular deflection of cantilevered beam 14 can be measured and then correlated to the appropriate temperature.

The base substrate 18 of micromechanical device 10 in one embodiment is silicon carbide (SiC) and the epitaxial layer 12 is a solid solution of aluminum gallium nitride ($Al_xGa_{1-x}N$). In addition, the upper region 18a of base substrate 18 from which the cantilevered beam 14 is formed, is doped to be p-type and the lower region 18b is n-type. The epitaxial layer 12 provides more than one function. As previously mentioned, the eptaxial layer 12 causes deflection of cantilevered beam 14 in response to the temperature. In addition, the epitaxial layer 12 forms an intermediate layer onto which piezoresistive element 22 is formed and also influences the mechanical characteristics of the cantilevered beam 14.

As mentioned above, the temperature sensor of micromechanical device 10 is one example of a micromechanical device of the present invention. In addition, the cantilevered beam 14 is one example of a micromechanical structure. Other examples of micromechanical structures which may be included in a micromechanical device of the present invention are membranes, microbridges, tethered proof masses, etc., the use of each, being dependent upon the desired application. For example, typically, membranes are suitable for use in pressure and acoustic sensors, microbridges are suitable for use in flow sensors, cantilevered beams are suitable for use in temperature, chemical, biochemical and inertial sensors, and tethered proof masses are suitable for use in inertial sensors. It is understood that each micromechanical structure may be suitable for more than one purpose. It is also understood that the micromechanical structures can be made from a wide range of single crystal semiconductor materials.

The epitaxial layer 12 of micromechanical device 10 is one example of an epitaxial layer included in a micromechanical device of the present invention. In the present invention, the material of the epitaxial layer is selected to meet the requirements of the desired application and the micromechanical structure employed, as well as to be compatible with the material of the base substrate from which the micromechanical structure is formed. As with the base substrate, the epitaxial layer may be made from a wide range of single crystal semiconductor materials having a wide range of properties and functions.

For example, some epitaxial layers are employed as a protective coating for protecting micromechanical structures. Such protection may be against chemicals, mechanical abrasion, heat, or to act as a diffusion and/or oxidation barrier. The protective coating may be employed to also improve or obtain desired mechanical properties, for example, to improve yield strength, increase toughness, tune resonant frequencies or provide vibration damping. In addition, some epitaxial layers are employed to provide a measurable response to external stimulation. Such epitaxial layers may have properties that are piezoelectric, piezoresistive, pyroelectric, electro-optic, magnetoresistive, have variable reflectivity or are sensitive to particular chemical or biological species, etc. These epitaxial layers may be employed to form a wide range of sensors, actuators, and electronic or optoelectronic devices when used in conjunction with the appropriate micromechanical structures. Furthermore, some epitaxial layers may be employed as an intermediate layer over which another layer of material is formed. Such an intermediate epitaxial layer may be employed as a buffer layer to prevent diffusion and/or oxidation between the separated materials. The intermediate epitaxial layer may also be employed to enable or improve the deposition of overlying materials for example, multiple quantum well structures. Although, the epitaxial layer may be formed of many different materials and perform many different functions, the material for a particular epitaxial layer must have a crystal structure which is compatible to that of the base substrate of the micromechanical structure in order for the layer to grow epitaxially on the base substrate. Alternatively, the material of the semiconductor base substrate may be selected to match a particular epitaxial layer material. The epitaxial layer is a single crystal or a highly oriented columnar structure with a certain degree of lattice mosaic in the film, depending on the lattice match (in dimensions as well as symmetry) between the epitaxial layer and the base substrate. For example, a GaN epitaxial layer with a hexagonal structure is compatible with and may be grown on a 6-H SiC (0001) substrate (which has the same structure but a 3% mismatch in lattice spacing) and on a (111) Si substrate (which has 17% lattice mismatch and cubic structure, but has the same in-plane symmetry as hexagonal GaN).

Figure 2A:
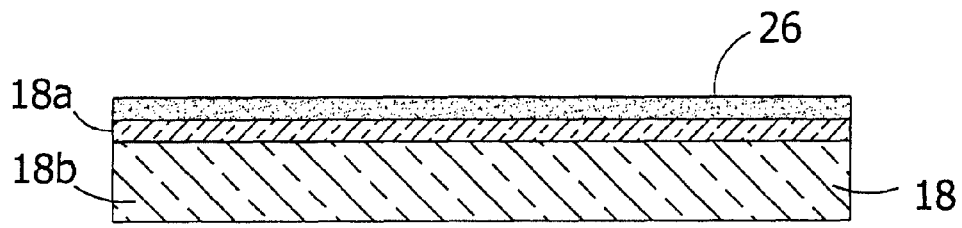
FIGS. 2A–2C are side sectional views depicting the formation of a micromechanical device according to one method.
Figure 2B:
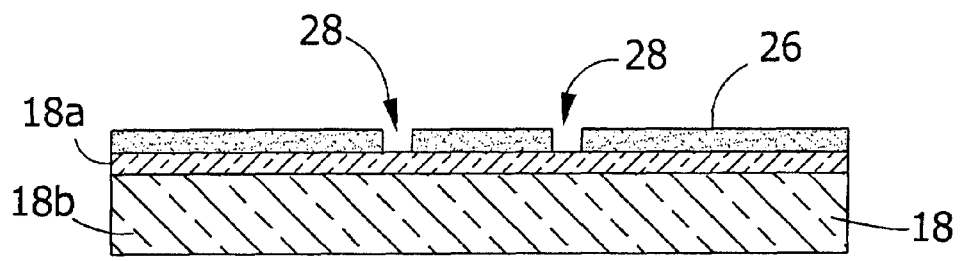
Figure 2C:
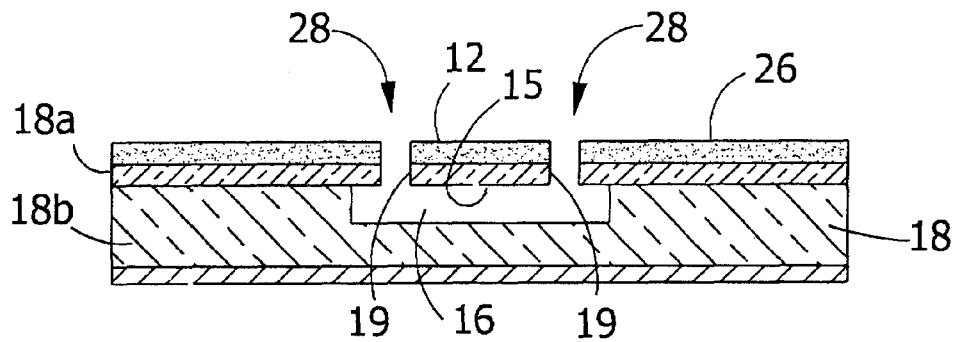

One method for forming a micromechanical device in accordance with the present invention using available micromachining techniques is depicted in FIGS. 2A–2C. Reference numeral 15 in FIG. 2C depicts a generic micromechanical structure which may be any suitable micromechanical structure such as the micromechanical structures described above. In FIG. 2A, a single crystal epitaxial layer 26 of semiconductor material having desired characteristics or properties is first grown on a single crystal semiconductor base substrate 18. The base substrate has an upper region 18a and a lower region 18b with one region being n-type and the other region being p-type. The material of the epitaxial layer 26 is selected to address the application at hand and may have any suitable characteristic or property such as those previously mentioned. The epitaxial layer 26 is deposited by any suitable method such as molecular beam epitaxy, pulsed laser deposition, vapor phase epitaxy, liquid phase epitaxy, evaporation or sputtering. As previously mentioned, the material of the epitaxial layer 26 is also selected to have a crystal structure that is compatible to that of the base substrate 18 which enables the epitaxial layer 26 to grow in a single crystal over the base substrate. A selected pattern 28 of the epitaxial layer 26 is removed, by etching, as seen in FIG. 2B. Referring to FIG. 2C, the portions of the upper region 18a of the base substrate exposed by the pattern 28 in the epitaxial layer 26 are etched to form a pattern 19 through the upper region 18a corresponding to pattern 28. A cavity 16 is then etched into the lower region 18b of base substrate 18 through the pattern 19 in the upper region 18a. Cavity 16 extends under portions of upper region 18a to form micromechanical structure 15. The portion of the epitaxial layer 26 on micromechanical structure 15 forms the epitaxial layer 12 which provides the micromechanical structure with the desired properties, such as those previously discussed.

Semiconductor materials suitable for base substrate 18 and epitaxial layer 26 are those chosen from columns IV, III–V, II–VI and IV–VI of the periodic table. Examples of semiconductor materials suitable for base substrate 18 include silicon (Si), silicon carbide (SiC), gallium arsenide (GaAs), indium phosphide (InP) and gallium nitride (GaN). Other examples include Ge, InAs, GaP, GaSb, InSb, ZnO, CdTe, ZnTe, etc. Examples of semiconductor materials suitable for epitaxial layer 26 include solid solutions of silicon, germanium and carbon (SiGeC), aluminum, gallium, indium, arsenic, antimony and phosphorus (AlGaInAsSbP) and aluminum, gallium, indium and nitrogen (AlGaInN). Other examples include solid solutions of zinc, cadmium, mercury, oxygen, sulfer, selenium and tellurium (ZnCdHgOSSeTe). Epitaxial materials such as III–V nitrides (for example solid solutions of AlN—GaN—InN) on silicon micromechanical structures are useful as UV emitters and detectors, blue LEDs, high power devices and piezoelectric films. Epitaxial layers of MnTe are useful for registering a change in electrical resistance in response to a magnetic field. SiC and AlN—GaN semiconductors have excellent thermal, mechanical, chemical and electrical properties which are suitable for harsh environments. Such semiconductors are inert in most environments except molten metals and salts and have high melting/decomposition temperatures (1700–3000° C.).

Another method of forming a micromechanical device 15 is depicted in FIGS. 3A–3E. Referring to FIG. 3A, a layer of masking material 30, for example, amorphous or polycrystalline oxide, is deposited on a single crystal semiconductor base substrate 18. Base substrate 18 has an upper region 18a and a lower region 18b of p and n types as in FIGS. 2A–2C. The layer of masking material 30 is formed of a material such as silicon dioxide ($SiO_2$), on which a single crystal epitaxial layer will not grow. Referring to FIG. 3B, the layer of masking material 30 is selectively etched to form a pattern 30a. Referring to FIG. 3C, a single crystal epitaxial layer 26 of semiconductor material having desired characteristics is deposited upon base substrate 18 and around the masked pattern 30a due to the fact that the epitaxial layer 26 cannot grow on the masked pattern 30a, and either does not deposit at all, or deposits as an amorphous or polycrystalline film which can be selectively removed. Referring to FIG. 3D, the masked pattern 30a is removed by an etching process to form a pattern 28 through the epitaxial layer 26. The pattern 28 exposes the upper region 18a of base substrate 18. Referring to FIG. 3E, the micromechanical structure 15 can then be etched in a manner similar to that described relative to FIG. 2C. The portion of the epitaxial layer 26 on micromechanical structure 15 forms epitaxial layer 12.

Figure 4A:
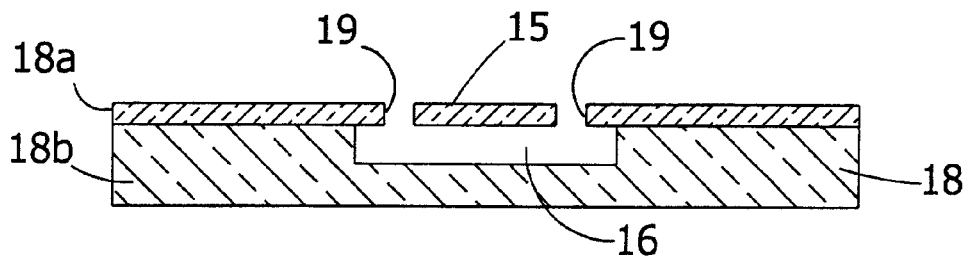
FIGS. 4A and 4B, are side sectional views depicting the formation of a micromechanical device according to still another method.
Figure 4B:
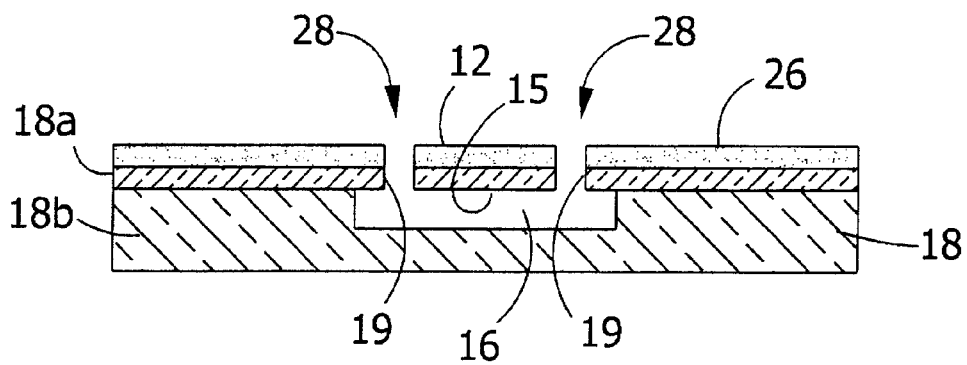

FIGS. 4A and 4B depict another method for forming a micromechanical device 15. Referring to FIG. 4A, a single crystal semiconductor base substrate 18 having upper 18a and lower 18b regions of p and n types, is etched to form a pattern 19 through the upper region 18a. A cavity 16 is etched in the lower region 18b of base substrate 18 extending through pattern 19 and under the upper region 18a to form the micromechanical structure 15. Referring to FIG. 4B, a single crystal epitaxial layer 26 of semiconductor material having desired characteristics is then deposited upon the micromechanical structure 15 and base substrate 18, thereby forming the epitaxial layer 12 on the micromechanical structure 15. The preferred methods of forming the epitaxial layer 26 are pulsed laser deposition and molecular beam epitaxy, but alternatively, can be any physical vapor epitaxy that provides a shower of ions for depositing material only on top surfaces.

Figure 5A:
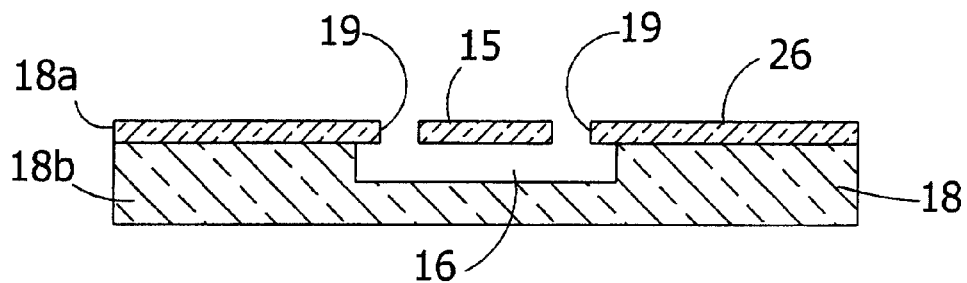
FIGS. 5A and 5B are side sectional views depicting the formation of a micromechanical device according to yet another method.
Figure 5B:
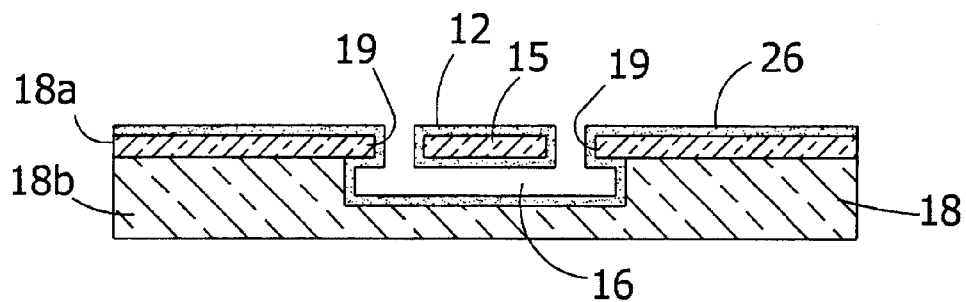

Yet another method of forming a micromechanical device is depicted in FIGS. 5A and 5B. Referring to FIG. 5A, the micromechanical structure 15 is micromachined from a single crystal semiconductor base substrate 18 in a similar manner as depicted in FIG. 4A. A single crystal epitaxial layer 26 of semiconductor material having desired characteristics is then applied to the single crystal base substrate 18 to cover all the exposed surfaces including those within cavity 16. The preferred method of depositing epitaxial layer 26 is by chemical vapor deposition and vapor phase epitaxy. As a result, the exposed top, bottom and sides of upper region 18a, micromechanical structure 15 and cavity 16 are all covered by the epitaxial layer 26, such that micromechanical structure 15 is encapsulated by an epitaxial layer 12. Consequently, micromechanical structure 15 has minimal residual stress and is temperature compensated since a film is present on opposing sides of the micromechanical structure 15. Depending upon the material selected, the epitaxial layer 26 may be suitable for providing chemical, oxidation, mechanical and thermal protection to the micromechanical structure 15 and base substrate 18 due to the encapsulation.

Figure 6A:
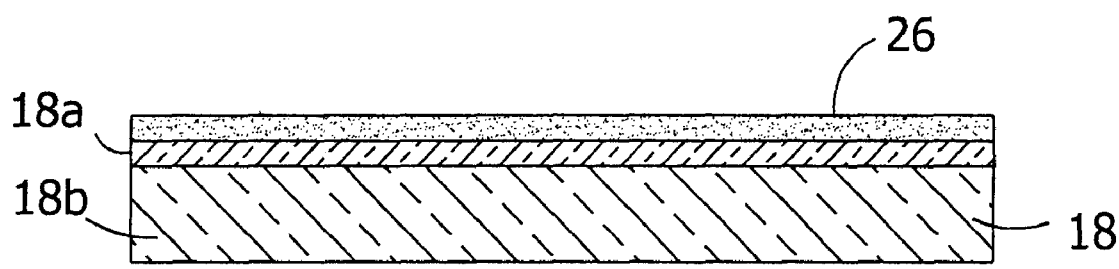
FIGS. 6A and 6B are side sectional views depicting the formation of a micromechanical device such as a membrane according to another method.
Figure 6B:
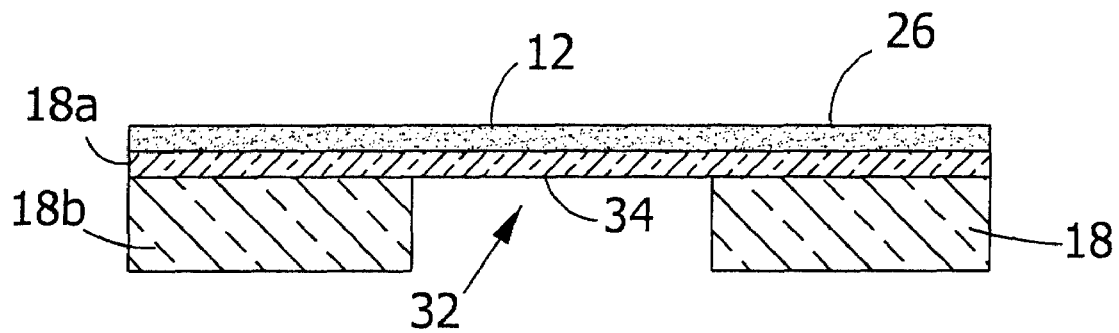

FIGS. 6A and 6B depict a method for forming a micromechanical structure such as a micromechanical membrane 34 having a single crystal epitaxial layer 12. Referring to FIG. 6A, a single crystal epitaxial layer 26 of semiconductor material having desired characteristics is deposited upon a single crystal semiconductor base substrate 18 having an upper region 18a and a lower region 18b of p and n types. Referring to FIG. 6B, the lower region 18b of base substrate 18 is etched on the side opposite to the epitaxial layer 26 to form a recessed area or trough 32 which extends to the upper region 18a of base substrate 18. The upper region 18a of base substrate 18 exposed by the trough 32 forms a thin membrane 34 and the portion of epitaxial layer 26 covering the membrane 34 forms epitaxial layer 12. Although the base substrate 18 depicted in FIGS. 6A and 6B preferably has both n-type and p-type regions, alternatively, base substrate 18 can be entirely n-type or entirely p-type.

While this invention has been particularly shown and described with references to preferred embodiments thereof, it will be understood by those skilled in the art that various changes in form and details may be made therein without departing from the scope of the invention encompassed by the appended claims.

For example, the micromachining techniques employed for forming the micromechanical devices 15 can be any known micromachining techniques such as chemical, electrochemical, photo-electrochemical and reactive ion etching, or any combination thereof. In addition, the use of single crystal materials allows the micromechanical devices of the present invention to be incorporated on the same wafer with other electronic devices such as amplifiers, processors etc., or more than one micromechanical device. Furthermore, although the single crystal epitaxial layer in the present invention is typically formed of a different material than the base substrate, in some cases, the epitaxial layer is formed from the same material. In such a case, the epitaxial layer and the base substrate may be formed so that one is p-type and the other is n-type. Also, more than one epitaxial layer may be deposited upon a micromechanical structure. The multiple layers may be on top of each other or side by side.

What is claimed is:

1. A micromechanical device comprising:
  a single crystal micromachined micromechanical structure, at least a portion of the micromechanical structure capable of performing a mechanical motion; and
  an epitaxial layer covering at least a part of said portion of the micromechanical structure that is capable of performing a mechanical motion, the micromechanical structure and the epitaxial layer being formed of different materials, the epitaxial layer being formed of a material that provides at least one of protective, strength, frequency, damping, piezoelectric, pyroelectric, electro-optic, magno-resistive, variable reflectivity, chemically sensitive and biologically sensitive properties.

2. The device of claim 1 in which the epitaxial layer is formed before the micromechanical structure is micromachined.

3. The device of claim 1 in which the epitaxial layer is formed on the micromechanical structure after the micromechanical structure is micromachined.

4. The device of claim 1 in which the epitaxial layer is formed of a material that provides a protective layer for the micromechanical structure.

5. The device of claim 1 in which the epitaxial layer is formed of a material that provides a measurable response to external stimulation of the micromechanical device.

6. The device of claim 5 in which the micromechanical device is a sensor.

7. The device of claim 5 in which the micromechanical device is an actuator.

8. The device of claim 5 in which the micromechanical device is an electronic device.

9. The device of claim 5 in which the micromechanical device is an optoelectronic device.

10. The device of claim 1 further comprising a secondary layer of material formed on the epitaxial layer, the epitaxial layer being an intermediate layer.

11. The device of claim 1 in which the micromechanical structure and epitaxial layer are each formed from a material selected from the group consisting of group IV, III–V, II–VI and IV–VI semiconductors.

12. The device of claim 1 in which the micromechanical structure is formed from a material selected from the group of solids consisting of Si, Ge, SiC, GaAs, InAs, InP, GaP, GaSb, InSb, GaN, ZnO, CdTe and ZnTe.

13. The device of claim 1 in which the epitaxial layer is formed from a material selected from the group of solid solutions consisting of SiGeC, AlGaInPAsSb, AlGaInN and ZnCdHgOSSeTe.

14. A micromechanical device comprising:
  a single crystal micromachined micromechanical structure, at least a portion of the micromechanical structure capable of performing a mechanical motion; and
  an epitaxial layer formed on at least a part of said portion of the micromechanical structure that is capable of performing a mechanical motion, the epitaxial layer being formed on the micromechanical structure after the micromechanical structure is micromachined, the micromechanical structure and the epitaxial layer being formed of different materials, the epitaxial layer being formed of a material that provides at least one of protective, strength, frequency, damping, piezoelectric, pyroelectric, electro-optic, magno-resistive, variable reflectivity, chemically sensitive and biologically sensitive properties.

15. The device of claim 14 in which the epitaxial layer is formed of a material that provides a protective layer for the micromechanical structure.

16. The device of claim 14 in which the epitaxial layer is formed of a material that provides a measurable response to external stimulation of the micromechanical device.

17. The device of claim 16 in which the micromechanical device is a sensor.

18. The device of claim 16 in which the micromechanical device is an actuator.

19. The device of claim 16 in which the micromechanical device is an electronic device.

20. The device of claim 16 in which the micromechanical device is an optoelectronic device.

21. The device of claim 14 further comprising a secondary layer of material formed on the epitaxial layer, the epitaxial layer being an intermediate layer.

22. The device of claim 14 in which the micromechanical structure and epitaxial layer are each formed from a material selected from the group consisting of group IV, III–V, II–VI and IV–VI semiconductors.

23. The device of claim 14 in which the micromechanical structure is formed from a material selected from the group of solids consisting of Si, Ge, SiC, GaAs, InAs, InP, GaP, GaSb, InSb, GaN, ZnO, CdTe and ZnTe.

24. The device of claim 14 in which the epitaxial layer is formed from a material selected from the group of solid solution consisting of SiGeC, AlGaInPAsSb, AlGaInN and ZnCdHgOSSeTe.

* * * * *